United States Patent
Caprara et al.

[11] Patent Number: 6,063,663
[45] Date of Patent: May 16, 2000

[54] METHOD FOR MANUFACTURING A NATIVE MOS P-CHANNEL TRANSISTOR WITH A PROCESS FOR MANUFACTURING NON-VOLATILE MEMORIES

[75] Inventors: Paolo Caprara, Milan; Claudio Brambilla, Concorezzo; Manlio Sergio Cereda, Lomagna; Valerio Cassio, Polonghera, all of Italy

[73] Assignee: SGS-Thomson Microelectronics S.r.l., Milan, Italy

[21] Appl. No.: 09/139,909

[22] Filed: Aug. 26, 1998

[30] Foreign Application Priority Data

Aug. 27, 1997 [EP] European Pat. Off. .............. 97830428

[51] Int. Cl.$^7$ .................................................. H01L 21/336
[52] U.S. Cl. ............................................ 438/257; 438/258
[58] Field of Search .................................... 438/257, 258, 438/FOR 203, FOR 189

[56] References Cited

U.S. PATENT DOCUMENTS 4,766,088  8/1988  Kono et al. .
5,950,088  9/1999  Park .

FOREIGN PATENT DOCUMENTS 0581 312  2/1994  European Pat. Off. .
0785 570  7/1997  European Pat. Off. .

*Primary Examiner*—George Fourson
*Attorney, Agent, or Firm*—Jenkens & Gilchrist, P.C.; Theodore E. Galanthay

[57] ABSTRACT

A method is provided of manufacturing a P-channel native MOS transistor in a circuit integrated on a semiconductor which also includes a matrix of non-volatile memory cells of the floating gate type with two polysilicon levels having an interpoly dielectric layer sandwiched between the two polysilicon levels. The method has the following steps: (1) masking and defining active areas of the discrete integrated devices; (2) masking and defining the first polysilicon level using a Poly1 mask; and (3) masking and defining an intermediate dielectric layer using a matrix mask. The length of the native threshold channel of the native transistor is defined by means of the matrix mask and by etching away the interpoly dielectric layer. A subsequent step of masking and defining the second polysilicon level provides for the use of a Poly2 mask which extends the active area of the transistor with a greater width than the previous mask in order to enable, by subsequent etching, the two polysilicon levels to overlap in self-alignment over the channel region.

7 Claims, 1 Drawing Sheet

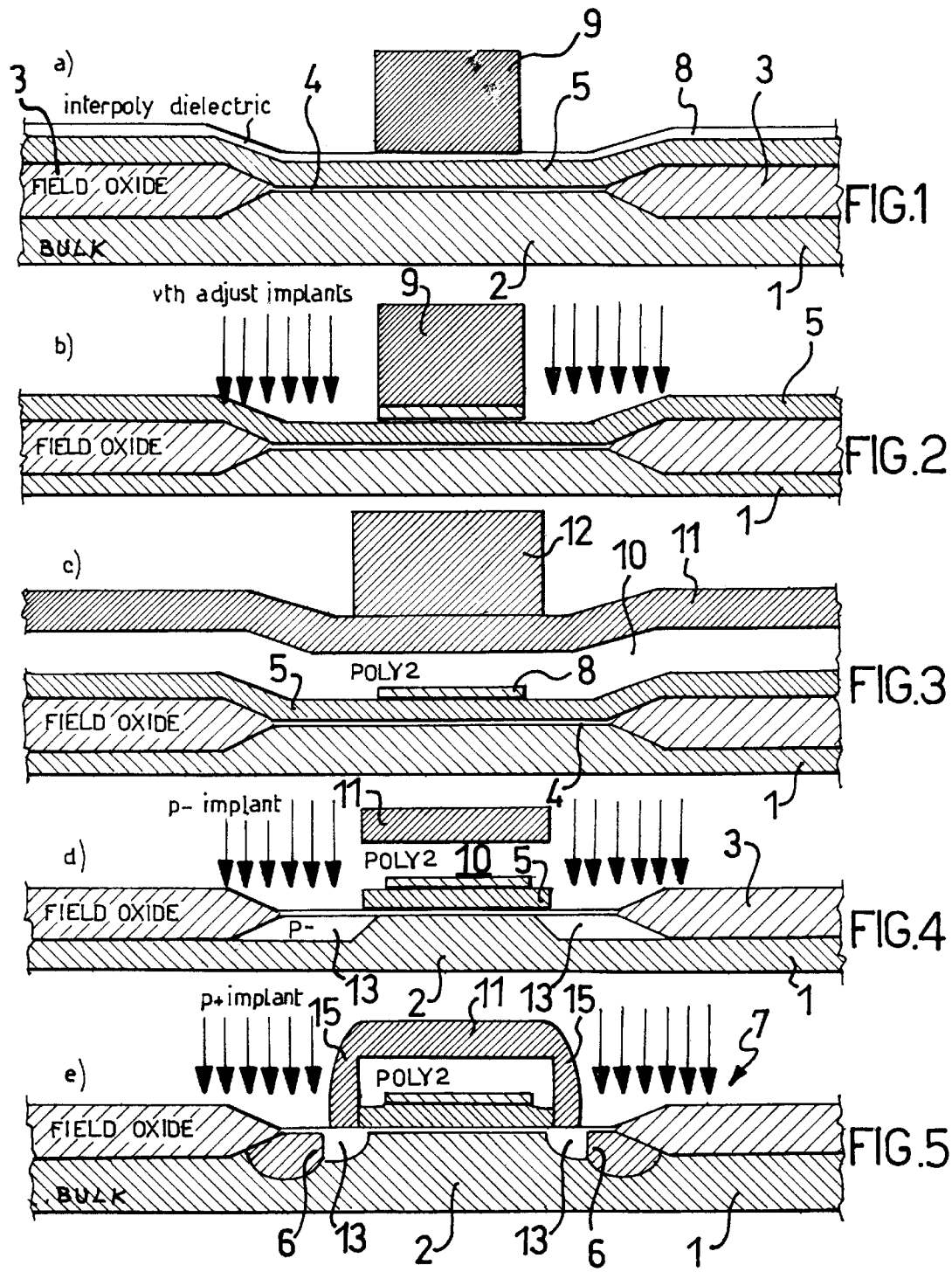

METHOD FOR MANUFACTURING A NATIVE MOS P-CHANNEL TRANSISTOR WITH A PROCESS FOR MANUFACTURING NON-VOLATILE MEMORIES

FIELD OF THE INVENTION

This invention relates to a method of manufacturing a P-channel native MOS transistor in a circuit integrated on a semiconductor which also includes a matrix of nonvolatile memory cells of the floating gate type with two polysilicon levels and having an interpoly dielectric layer sandwiched between the two polysilicon levels.

BACKGROUND OF THE INVENTION

Background Art

As is well known, processes for manufacturing integrated electronic structures which include non-volatile memory cells, that is matrices of cells organized into rows and columns, using a dual level of polysilicon with an interpoly dielectric isolation layer interposed between the two polysilicon levels, are extensively used in the industry. These processes provide for a first masking and implanting step to define well regions in a semiconductor substrate. The well regions have a different type of conductivity from that of the substrate.

Conventional processes provide for the initial definition of the active areas of the various integrated devices (transistors, memory cells, etc.). Usually, a subsequent oxide growing step also is provided to form field isolation regions formed by a thick oxide layer which isolates the discrete active areas from each other. In some cases, the process may include a relatively heavy implantation for threshold raising purposes, which is usually performed in the matrix area, that is in the region where the memory cells are formed. However, this operation alternatively may be carried out at a later stage of the manufacturing process.

To enable all the aspects of the present invention to be more clearly understood, it is useful to summarize the sequence of process steps which result, at the present state of the art, in the formation of an integrated circuit of non-volatile memory cells.

A thin oxide layer, called the gate oxide, is grown over the active areas. A first layer of polysilicon, referred to as the first-level polysilicon or Poly1, then is deposited onto the gate oxide. Thereafter, a masking and etching step usually is carried out for a preliminary definition of the Poly1 which is to form part of the floating gate regions of the memory cells. An intermediate isolation dielectric layer, called the interpoly, next is grown and/or deposited over the entire resultant structure. This dielectric layer may be a stack structure, i.e. comprised of a first oxidation layer overlaid by a thin layer of nitride, and a third layer of nitride oxidation. Such a dielectric layer is referred to as the ONO layer.

At this stage of the manufacturing process, a masking step is carried out to thoroughly remove the interpoly layer, except from the matrix area occupied by the memory cells. For this reason, the mask employed here is commonly termed the "matrix" mask. Subsequently, a second layer of polysilicon, known as the second-level polysilicon or Poly2, is deposited and doped. Inside the matrix area, the Poly2 will remain isolated from the Poly 1 by the interpoly layer. In the regions outside the area occupied by the cell matrix, i.e. the regions accommodating the transistors and other external circuitry devices, the Poly2 layer overlies the existing Poly1 layer directly.

The above process steps are described in U.S. Pat. No. 4,719,184 issued to the Assignee of Applicants.

As previously mentioned, a further masking step may become necessary in some cases to provide a slight implant for adjusting the light voltage shift ("LVS") threshold of certain transistors in the external circuitry. Other low-threshold transistors, or so-called native transistors, must instead be screened off this implant. Yet another masking step, and associated etching, allows the channel length of the transistors in the circuitry to be defined. A mask, designated Poly2, is used during this step which also allows the second-level polysilicon to be defined in the matrix area, with the etching stopped short of the intermediate interpoly layer.

An improvement in the above manufacturing method has been aimed at the formation of the native transistors. This improvement is described in European Patent Application No. 96830021.0 by the Applicant. In essence, a much more effective way of forming native transistors, within a standard manufacturing process like that just described, has been provided. This method substantially eliminates the masking step for threshold adjustment in the external circuitry transistors, thereby lowering the manufacturing costs. The same matrix mask that is used for etching away the interpoly dielectric layer is used to define the channel length of the native transistors located outside the area occupied by the matrix. Accordingly, instead of carrying out the LVS step, the matrix mask is suitably modified and also employed for masking the channel area within the active area of the native transistors located outside the matrix area. These native transistors are formed unconventionally with respect to the other raised-threshold transistors. The aforementioned European Patent Application discloses all the details about this formation.

The present invention fits in the same line of research that resulted in the method just described. The underlying technical problem of this invention is to provide a novel method of manufacturing a P-channel native MOS transistor, within the frame of a process for manufacturing non-volatile memories, which method has features appropriate to ensure the desired formation regardless of the threshold adjusting implantations applied to other enhancement transistors in the external circuitry of the matrix area, and therefore to avoid one masking level. In other words, the aim is to enable a P-channel native transistor to be made without one masking level, while preventing subsequent LDD implantations from altering the threshold of the transistor.

SUMMARY OF THE INVENTION

The solution to the problem described is to have the nominal length of the channel region of the native transistor defined by means of the same matrix mask used to define the matrix regions, and to utilize a second mask of Poly2, wider than the former, to ensure an aligned overlap of the two polysilicon levels over the channel region.

Additional objects, advantages, novel features of the present invention will become apparent to those skilled in the art from this disclosure, including the following detailed description, as well as by practice of the invention. While the invention is described below with reference to preferred embodiment(s), it should be understood that the invention is not limited thereto. Those of ordinary skill in the art having access to the teachings herein will recognize additional implementations, modifications, and embodiments, as well as other fields of use, which are within the scope of the invention as disclosed and claimed herein and with respect to which the invention could be of significant utility.

BRIEF DESCRIPTION OF THE DRAWINGS

FIGS. 1, 2, and 3 are enlarged vertical cross-section views showing schematically a portion of a semiconductor substrate subjected to successive steps of the inventive method which lead to the formation of a P-channel native transistor; and FIGS. 4 and 5 are schematic views of the portion in FIGS. 1–3 as subjected to final steps of the manufacturing method according to the invention.

DETAILED DESCRIPTION OF A PREFERRED EMBODIMENT OF THE INVENTION

Referring to the drawings, generally and schematically shown at 1 is a portion of a semiconductor substrate where a P-channel native MOS transistor is formed in accordance with this invention.

The method of this invention provides for the formation of well regions in the substrate 1 which have a different type of conductivity as compared to the substrate. Similarly to conventional processes, the definition of the active areas 2 also includes the formation of isolation regions 3 by the growing of a thick layer of field oxide.

At this stage, a relatively heavy threshold-raising implantation can be performed, unless already performed at an earlier stage, in the matrix area, i.e. the region where the memory cells are formed. A thin layer 4 of gate oxide is formed over the active areas, also by a standard process sequence. The process goes on with the deposition of a first layer 5 of polysilicon, called the Poly1. This layer 5 is suitably doped with phosphorus.

A masking and etching step of the Poly1 layer 5 is carried out to define the floating gate regions of the cells in the memory matrix. These regions are not shown because the point of interest lies in the regions outside the matrix area, specifically in the regions where native transistors 7 associated with the external circuitry of the memory matrix are located.

Accordingly, only a portion of a semiconductor substrate is shown in FIG. 1 where the P-channel MOS transistor 7 is formed by the method of this invention.

The masking and etching of Poly1 spares the first-level polycrystalline layer 5 over the active areas of the native transistors 7.

The manufacturing process goes on with a thermal oxidation and/or deposition treatment which leads to a dielectric isolation layer 8, called the interpoly, being formed. Using a modified matrix mask 9, e.g. as described in European Patent Application No. 96830021.0, a central or channel area is defined for the transistor 7 at this stage. This mask 9 has a predetermined width, and allows the dielectric layer 8 to be removed from the circuitry zones, and the nominal length of the native threshold of transistor 7 to be defined, as shown in FIG. 1.

In fact, the dielectric layer 8 is etched away and a slight LVS implantation is performed in the channel zones of the transistors belonging to the external circuitry of the matrix area, through the openings in the matrix mask. However, the mask 9 will be screening the native threshold channel region of the transistor 7 from the LVS implant, as shown in FIG. 2. The mask 9 is then removed, and the native threshold channel region left covered by a portion of the dielectric layer 8.

A second layer 10 of polycrystalline silicon, called the Poly2, is deposited next as shown in FIG. 3. A layer of a silicide 11, preferably of a tungsten silicide $WSi_x$, also can be deposited over this layer 10. At this stage, a mask 12 of Poly2, that is one for defining the second-level polysilicon, is used on the channel region of the transistor 7.

Advantageously in this invention, the mask 12 is wider than the matrix mask 9, as can be seen in FIG. 3. In this way, the contact is maintained between the layers 5 and 10 of Poly1 and Poly2, both over the field oxide region 3 and the active area 2. In essence, the use of a Poly2 mask 12 of greater width than the previous mask 9 allows two levels 5 and 10 of polysilicon to overlap each other in self-alignment over the channel region. An etching step then is carried out on the stack structure formed of the silicide 12, the Poly2 10, and the Poly1 5.

A stack structure is left to overlie the active area 2 of the transistor 7, centrally of the channel region, which comprises the layers 5 and 10 of Poly1 Poly2 in mutual contact but for a central zone which is separated by a trapped portion of interpoly 8.

At this stage, a P⁻ implantation of the lightly doped drain ("LDD") type can be carried out as shown schematically in FIG. 4. This implant will affect the zones laterally of the channel region, as indicated at 13 in FIG. 4.

The method of this invention includes the formation of so-called spacers 15, on opposite sides of the stack structure which rises centrally in the channel region. These spacers 15 screen at least part of the underlying P⁻ doped zones 13 from further implantations.

FIG. 5 shows a subsequent process step of performing a P⁺ implantation in the lateral zones of the channel region. By using the masking afforded by the spacers, this further P⁺ implantation allows the junctions 6 of the LDD type to be defined laterally of the channel region with great accuracy. Thus, the method of this invention enables a P⁻ channel native MOS transistor structure 7 to be defined in which the nominal length of the native threshold channel is determined by the matrix mask 9. This expedient provides a device with desired characteristics, a P-channel native transistor in this case, in a manner wholly independent of LDD implantations which might be performed with sufficient energy to go through the Poly1 layer and dope the underlying substrate. In this situation, two channel zones would be produced laterally of and in series with the native transistor whose characteristics cannot be predetermined. Such zones would be activated by a gate voltage also not to be predetermined relative to that required to activate the native concentration channel region, thereby impairing the native transistor operation.

This consideration leads to the conclusion that the principles of the invention do not appear to be applicable to the formation of N-channel native transistors because, in this case, the two LVS zones associated in series with the channel would be turned on at a higher gate voltage than the native concentration channel region, which would shift the transistor threshold.

It will be appreciated from the foregoing description that the formation of the P-channel native MOS transistor by having the two polysilicon layers Poly1 and Poly2 overlap each other in self-alignment has the advantage of providing similar spacers to those of standard transistors, and therefore with the same drain architecture.

Furthermore, in the instance of a compensated LDD as described in U.S. Pat. No. 4,719,184, the uncertainty of an LDD implantation performed through the Poly1 layer, likely to make the threshold of the parasitic transistors associated with the structure unstable, is avoided.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention and the claims.

We claim:

1. A method of manufacturing a P-channel native MOS transistor in a circuit integrated on a semiconductor which also includes a matrix of non-volatile memory cells of the floating gate type with two polysilicon levels and having an interpoly dielectric layer sandwiched between the two polysilicon levels, said method comprising the steps of:

masking and defining active areas of the discrete integrated devices;

masking and defining the first polysilicon level using a Poly1 mask;

masking and defining an intermediate dielectric layer using a matrix mask:

wherein the length of the native threshold channel of said transistor is defined by means of the matrix mask and by etching away the interpoly dielectric layer, and that for a subsequent step of masking and defining the second polysilicon level, a Poly2 mask is used which extends the active area of the transistor with a greater width than the previous matrix mask to enable, as by subsequent etching, the two polysilicon levels to overlap in self-alignment over the channel region.

2. The method according to claim 1, wherein said matrix mask extends the channel area of the native transistor and is utilized for screening said channel area from a threshold adjust implant of other transistors outside the matrix area.

3. The method according to claim 1, further comprising an etching step for defining, centrally of the channel region, a stack structure formed by the Poly1 and Poly2 levels in mutual contact excepting at a central zone separated by a trapped portion of interpoly.

4. The method according to claim 3, further comprising a $P^-$ implantation of the lightly doped drain type in the lateral zones of the channel region.

5. The method according to claim 3, further comprising the formation of spacers on opposite sides of the stack structure which rises centrally of the channel region.

6. The method according to claim 5, further comprising a $P^+$ implantation in the lateral zones of the channel region, which zones, through being partly screened off by the spacers, enable junctions of the lightly doped drain type to be defined laterally of the channel region.

7. The method according to claim 1, wherein said first mask screens the channel region from a slight light voltage shift implantation.

* * * * *